United States Patent
Hoffmaster et al.

[11] Patent Number: 6,091,749
[45] Date of Patent: Jul. 18, 2000

[54] LASER SYSTEM CONTROLLER

[75] Inventors: David K. Hoffmaster, Long Beach; Terry L. Wetkowski, Palos Verdes Estates, both of Calif.

[73] Assignee: TRW Inc., Redondo Beach, Calif.

[21] Appl. No.: 09/031,328

[22] Filed: Feb. 26, 1998

[51] Int. Cl.[7] ........................................ H01S 3/10
[52] U.S. Cl. .................. 372/38; 372/25; 372/26; 372/29
[58] Field of Search ................... 372/24, 25, 26, 372/28, 29, 32, 33, 38, 108, 109

[56] References Cited

U.S. PATENT DOCUMENTS

| | | | |
|---|---|---|---|
| 5,287,375 | 2/1994 | Fujimoto | 372/38 |
| 5,390,204 | 2/1995 | Yessik et al. | 372/38 |
| 5,604,757 | 2/1997 | Liang et al. | 372/29 |
| 5,604,759 | 2/1997 | Miyaki et al. | 372/38 |
| 5,812,572 | 9/1998 | King et al. | 372/38 |
| 5,914,484 | 6/1999 | Tawarayama et al. | 372/38 X |

*Primary Examiner*—Brian Healy
*Attorney, Agent, or Firm*—Michael S. Yatsko

[57] ABSTRACT

A laser controller (12) that has particular application for controlling a solid state diode laser (10) including a series of gain modules and associated diode arrays. The laser controller (12) includes a control console (44) including a touch screen (46) that allows a laser operator to interface with the controller (12) to control the laser (10) and laser parameters. The control console (44) includes a target monitor (50) that allows the operator to view the laser beam at a reduced beam intensity for alignment and beam quality purposes. The laser controller (12) further includes a computer (14) having a counter circuit (20) that outputs a signal to set the pulse width and pulse rate of the laser beam output. This control allows the laser beam output to be ramped from one beam intensity to another beam intensity during a laser operation. The counter/timer circuit (24) and a series of end of pulse detectors (26) in the controller (12) allow sequencing of the output signal to the various diode arrays in the gain modules so that the laser beam output can be formed into a continuous wave. The computer (14) further includes a pattern generator that outputs a signal that ramps a laser beam modulator to modulate the beam output pulse into a stream of smaller, higher peak energy, pulses. The laser controller (12) also includes a power supply interface system (58) that isolates the control computer (14) from the primary power supplies (16) that provide power to the diode arrays. A laser mirror motor control system (66) allows the operator to manually control the mirrors of the laser (10) through the control console (44). Shut down electronics (70) bypass the computer (14) and automatically shut down the primary power supplies (16) in the event of a safety breach.

24 Claims, 2 Drawing Sheets

LASER SYSTEM CONTROLLER

BACKGROUND OF THE INVENTION

1. Field of the Invention

This invention relates generally to a laser system controller for controlling the operating parameters of a laser and, more particularly, to a laser system controller for controlling the operating parameters of a solid state diode laser, including ramping of the power output of the laser beam.

2. Discussion of the Related Art

High-power, solid state lasers, such as diode slab lasers, that are used for many purposes, such as cutting, drilling and welding of various materials for precision laser machining (PLM), electronics manufacture, medical treatment, nuclear fusion, laser weapons, etc., are known in the art. A solid state slab laser will include one or more gain modules each having a solid state laser gain medium, such as a crystal of neodymium yttrium aluminum garnet (Nd:YAG), Yb:YAG, Ti:Sapphire or neodymium glass (Nd:Glass), and an optical pumping source to produce a population inversion in the gain medium. The gain medium typically has a slab configuration with a rectangular cross-section and optically polished major side and end faces. The optical pumping source generally is one or more diode arrays positioned adjacent to the side faces of the slab. The laser gain medium absorbs light radiation from the diode arrays to create a population inversion within the medium to produce a laser beam output. The end faces of the slab are preferably formed at a non-perpendicular angle to the side faces so that light travels longitudinally in a zig-zag pattern through the laser gain medium as it is reflected off of the side faces. A high power solid state slab laser of this type is disclosed in U.S. Pat. No. 5,555,254 issued to Injeyan et al., Sep. 10, 1996 and U.S. patent application Ser. No. 08/683,585, filed Jul. 15, 1996, now U.S. Pat. No. 5,790,575, titled Diode Laser Pumped Solid State Laser Gain Module, and assigned to the assignee of the instant invention.

The diode arrays are switched on and off or pumped in a controlled manner to generate a pulsed laser beam emitted from the gain medium that has a particular pulse rate and pulse width. The light output of the diode arrays can be accurately tuned to the absorption line of the active material of the laser gain medium to achieve a high pumping efficiency. An increase in the pulse rate and/or pulse width increases the power output of the laser beam. The diode arrays are fired in a controlled manner to set the pulse width and pulse rate of the output beam. The firing of the various diode arrays for multiple gain modules can be controlled independently of each other or sequenced to further control the overall pulse width and rate of the laser beam, or generate a continuous wave (CW) beam. Therefore, depending on the particular application, the pulse rate and pulse width of the beam output is controlled for efficient laser operation for that application.

Depending on the particular application of the laser beam, it may be desirable to modulate the laser beam to provide high peak power pulses for cutting and drilling applications. The modulator modulates the relatively long pulses from the gain modules to provide short duration beam pulses (such as on the order of 100 nanoseconds) having a relatively high peak power, for example, on the order of 500 kilowatts, that provides greater precision and control for certain applications. In one example, the laser beam pulses generated by the high power solid state laser gain module are modulated by an acoustical optical (AO) modulator that provides the modulation wave for modulating the beam pulses from the gain module. The modulated wave is also capable of being varied in frequency and pulse width to give even greater variability for different applications and materials. U.S. patent application Ser. No. 08/593,961, filed Jan. 30, 1996, titled "Laser Pulse Profile Control By Modulating Relaxation Oscillations", assigned to the Assignee of this application, provides a more detailed discussion of a modulator for a solid state diode slab laser.

To perform a PLM operation, a laser operator will calibrate or program a controller that controls the laser to operate the laser beam at a desired power level and machining sequence to perform the desired machining operation. A single machining operation may include various degrees of cutting, welding and drilling of a single workpiece or multiple workpieces. For example, the machining operation may require a welding operation and then immediately thereafter, drilling of a series of holes and/or cutting the workpiece. The welding operation generally requires different power levels than cutting and drilling operations, and cutting and drilling operations generally require that the beam be polarized and modulated to provide high peak power for efficient operation. Additionally, the welding process itself may require different laser power levels. For example, welding around a corner of the workpiece may require a decrease in power because the welding operation may have to be slowed down and the resulting higher power may damage or burn the material of the workpiece at the slower speed. Further, the laser can be calibrated to weld a certain material, such as steel. If the operator then changes to a different material, such as a different steel, aluminum, copper, etc., different laser settings and output parameters would be required, so the controller needs to be able to be readily changed to the appropriate settings. Thus, the laser controller needs to be programmed to provide these changes in power output level for different operations during the machining operation.

State of the art solid state diode lasers also allow the laser controller to vary the current applied to the diode arrays to change the intensity of the laser beam output. As the sophistication of precision laser machining increases, the sophistication of the controllers also need to increase. The known controllers for solid state diode lasers typically can only change the output power of the laser from one power level to another. It has been recognized that the effectiveness of the laser machining process could be increased by providing a controller that causes the output of the diode arrays to ramp the power of the laser beam from one level to another during the machining operation. Other improvements can be made to the laser controller to increase the efficiency of the laser machining process.

It is an object of the present invention to provide a laser controller that provides for ramping the power output of the laser beam in a solid state diode laser, as well as providing other improvements over the known laser controllers to increase user interface and the like.

SUMMARY OF THE INVENTION

In accordance with the teachings of the present invention, a laser controller is disclosed that has particular application for a controlling solid state diode laser including a series of gain modules and associated diode arrays. The laser controller includes a control console including a touch screen that allows a laser operator to interface with the controller to control the laser and laser parameters. The control console includes a target monitor that allows the operator to view the laser beam at a reduced beam intensity for alignment and beam quality purposes. The laser controller further includes a control computer having a counter/timer circuit that outputs a signal to the laser diode power supplies to set the pulse width and pulse rate of the laser beam output. This control allows the laser beam output to be ramped from one beam intensity to another beam intensity during a laser operation. The circuit also uses a series of end of pulse detectors that allow sequencing of the various diode arrays in the gain modules so that the laser beam output can be further varied or formed into a continuous operation.

The laser controller also includes a digital word generator that outputs a signal to a modulator to modulate the laser beam during the laser beam pulse on time. This additional modulation breaks the longer laser pulse into a series of shorter, compressed, pulses with even greater energy. The width and rate of these smaller pulses can be varied or ramped to tailor the laser beam for maximum effectiveness on different materials.

The laser controller also includes a power supply interface system that isolates the control computer from the primary power supplies that provide power to the diode arrays. A laser mirror motor control system allows the operator to manually control the mirrors of the laser through the control console. Shut down electronics bypass the computer and automatically shut down the primary power supplies in the event of a safety breach.

Additional objects, advantages and features of the present invention will become apparent from the following description and appended claims, taken in conjunction with the accompanying drawings.

DETAILED DESCRIPTION OF THE PREFERRED EMBODIMENT

The following description of the preferred embodiments directed to a laser controller is merely exemplary in nature, and is in no way intended to limit the invention or its applications or uses. For example, the description of the laser controller of the invention will be described for controlling a solid state diode laser for a PLM operation. However, the laser controller of the invention may have application for other types of lasers or other types of machines.

Figure 1:
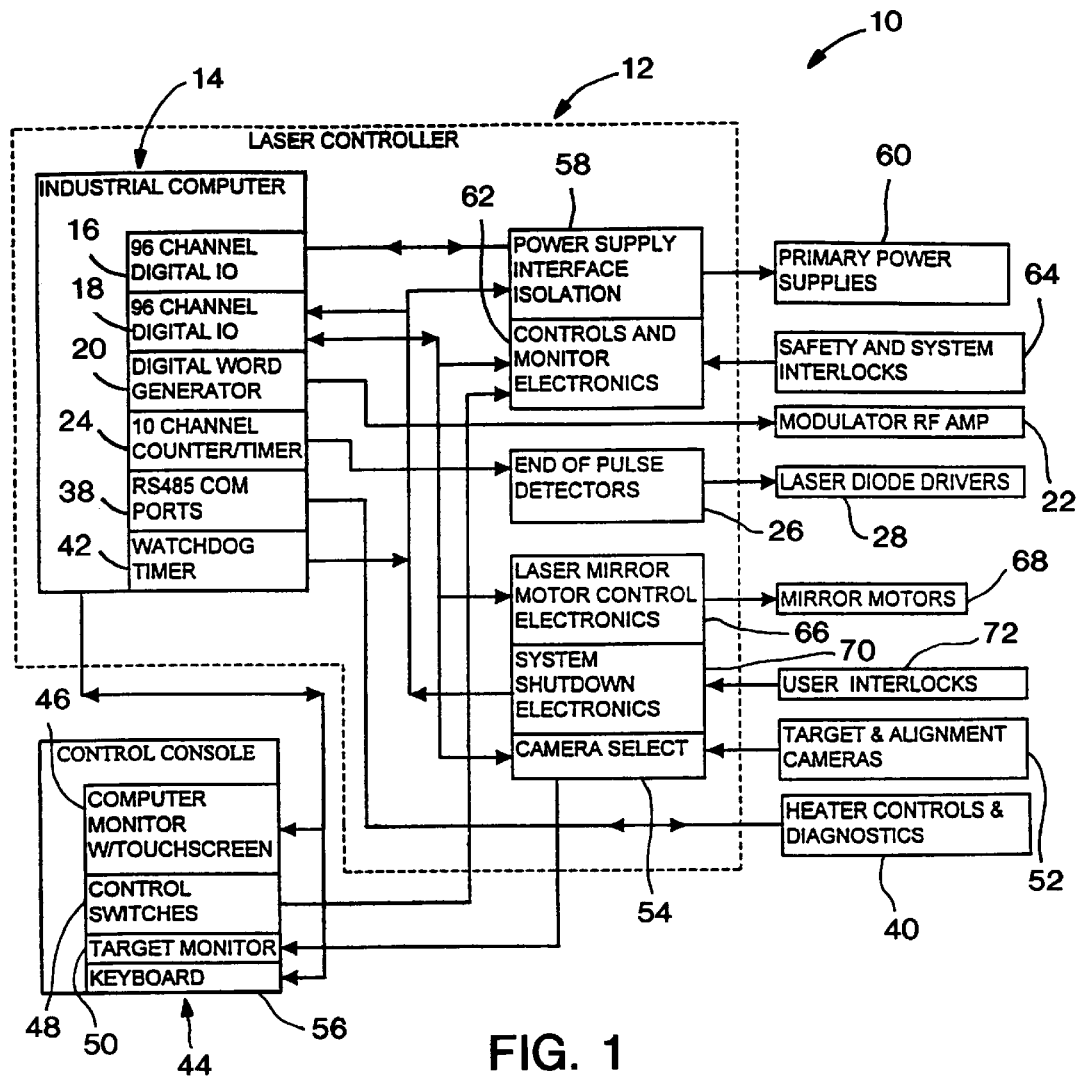
FIG. 1 is a block diagram of a laser system including a laser controller according to an embodiment of the present invention.

FIG. 1 is a block diagram of a laser system 10 including a laser controller 12, according to an embodiment of the present invention. The laser controller 12 includes an industrial computer 14 that is the central control device of the controller 12. The computer 14 can be any commercially available computer suitable for the purposes described herein, for example, a computer from Industrial CPU Systems. The computer 14 includes two ninety-six (96) channel digital input/output (I/O) ports 16 and 18 that are digital input and output interfaces to allow the computer 14 to interface with other digital devices, as is well understood in the art.

The computer 14 also includes a ten channel counter/timer circuit board 24 used to set the pulse width and rate for energizing the diode arrays in the gain modules. The counter/timer board 24 can energize the diode arrays in any suitable time frame for different applications. The counter/timer board output signal controls the pulse width and pulse rate of the laser diode arrays. Both of these parameters can be ramped to vary the laser output power during laser operation. The various diode arrays can also be fired in a consecutive sequence so that the laser beam output is effectively a continuous wave output at a lower power. The diodes that are used in the state of the art diode arrays can handle a very large amount of power for short durations, but will burn out if the duration is too long. The counter/timer board 24 is programmed with the desired pulse widths, and the pulsed output signals are applied to a series of end of pulse detectors 26, described in more detail below. Output signals from the counter/time board 24 are applied to laser diode drivers 28 that control the firing of the diode arrays.

Figure 2:
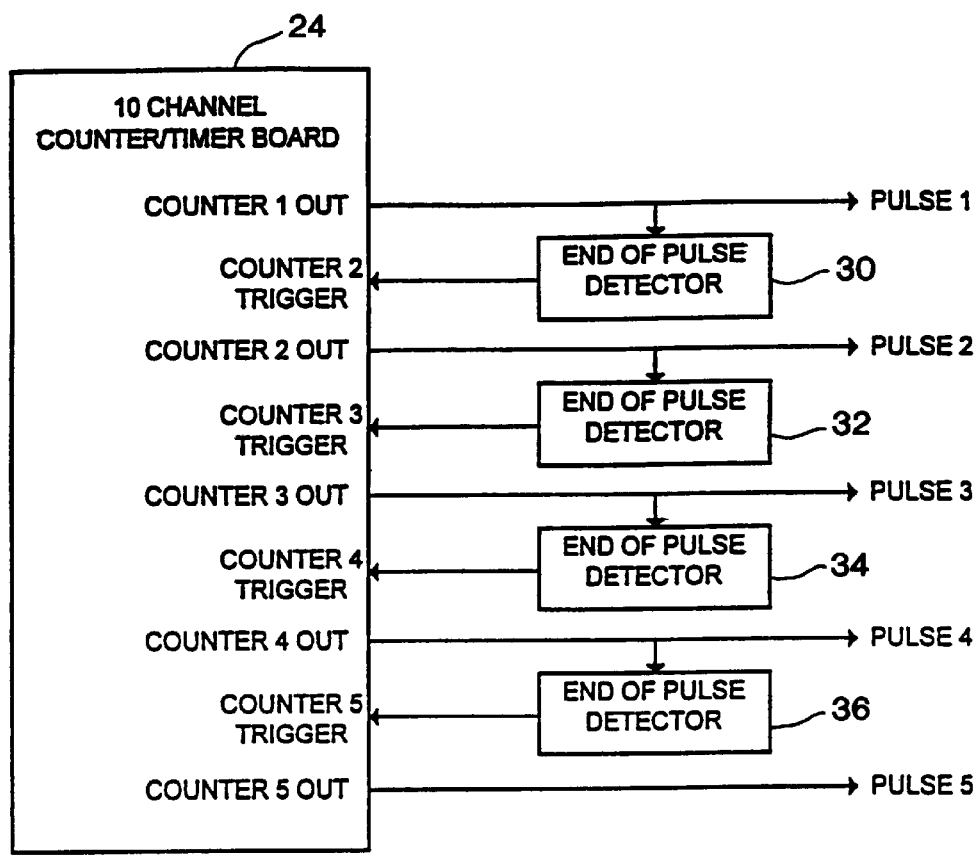
FIG. 2 is a block diagram of a counter/timer board and a series of end of pulse detectors that provide sequencing of a series of diode arrays of the laser system shown in FIG. 1.
Figure 3:
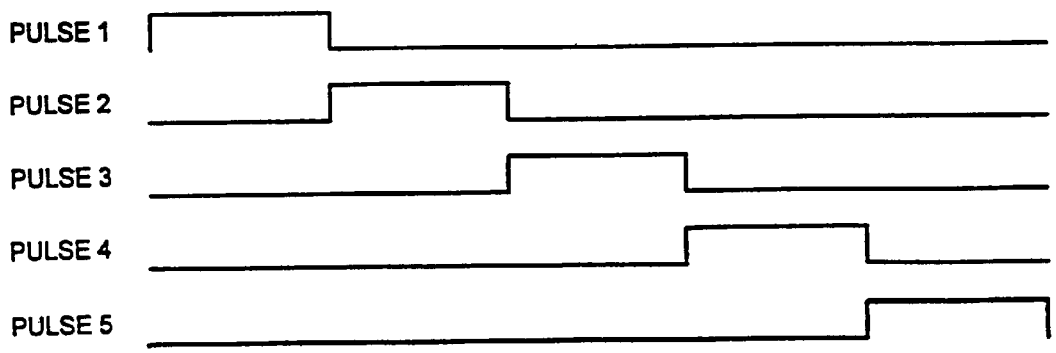
FIG. 3 is a series of pulse outputs from the counter/timer board shown in FIG. 2.

FIG. 2 shows a more detailed diagram of the counter/timer board 24 separated from the computer 14, where the end of pulse detectors 26 are shown as separate end of pulse detectors 30, 32, 34 and 36 that provide a pulse phasing operation. In one embodiment, five channels of the counter/timer board 24 are used to set the diode pulse sequence. The counter/timer 24 board is also used to measure the flow rate of the cooling water to the diode arrays. The five channels from the counter/timer board 24 provide suitable output pulses to energize the separate diode drivers 28 for five different diode arrays. Each pulse output for each separate diode array is labeled as pulse 1–pulse 5. FIG. 3 shows the sequencing of the pulses 1–5 relative to each other. A first channel of the board 24 outputs pulse 1 to fire the first diode array, and the end of pulse detector 30 detects the falling edge of pulse 1. When the end of pulse detector 30 detects the end of pulse 1, it outputs a signal to the board 24 that triggers the board 24 to output pulse 2 from the second channel to fire the second diode array. The end of pulse detector 32 detects the falling edge of pulse 2, and outputs a signal to the board 24 that triggers pulse 3 from the third channel to fire the third diode array. The end of pulse detector 34 detects the falling edge of pulse 3, and outputs a signal to the board 24 that triggers pulse 4 from the fourth channel to fire the fourth diode. The end of pulse detector 36 detects the falling edge of pulse 4, and outputs a signal to the board 24 that triggers pulse 5 from the fifth channel to fire the fifth diode array. Although not shown, an end of pulse detector would detect a falling edge of pulse 5 to trigger pulse 1 again. This sequence continues so that the output laser beam is effectively a continuous wave beam. Of course, the board 24 can be programmed so that some arrays are fired at the same time, or the sequence is in a different manner. Additionally, the counter/timer board 24 can be programmed to sequence less than five diode arrays or more than five diode arrays.

The computer 14 also includes a digital word generator 20 that provides digital output signals to an RF amplifier 22. The amplifier 22 generates an RF signal that controls an AO modulator for modulation of the output beam of the laser system 10. The digital word generator 20 is a pattern generator that is programmed by software with a set of digital patterns that are sequentially clocked out up to a rate of, for example, 20 MHz. This clocked output pattern generates the modulation pulses that modulates the diode array pulses into high intensity peak pulses. The diode arrays (not shown) are pulsed on for some period of time by the counter/timer board, for example 500 microseconds. During this on time, the AO modulator switches the laser beam on and off to allow lasing or inhibit lasing to generate the high intensity pulses. The pulse pattern from the generator 20 controls the AO modulator at the desired pulse width and frequency, or ramped in either or both parameters, to break up the laser pulses to form the high peak pulses. A more detailed description of this type of modulation can be found in the '961 application referenced above. The digital word generator 20 is programmed or calibrated for a particular PLM operation.

The computer 14 also includes a series of RS 485 comm ports 38 that provide communication to other system devices on a common bus. One of the ports 38 provides a temperature control signal to heater controls and diagnostics 40. The heater controls 40 control one or more heaters, for example, edge bar heaters (not shown), that are used to maintain each of the laser gain modules at a specific temperature for different applications. It is necessary that the gain modules have a consistent temperature to operate effectively in a stable manner, as is well understood in the art. The computer 14 tells the controller 12 what temperature to run the gain modules for a specific pulse setting, and those temperature signals are output from one of the ports 38 to the heater controls 40. The diagnostics control 40 monitors the light output power monitor of the laser system 10 as a voltage signal. In one embodiment, another of the ports 38 is used to connect an external computer (not shown) so that the controller 12 can be operated from a remote site. This RS 485 port can also be configured as a RS 422 port.

A watch dog timer 42 monitors the operation of the computer 14 as a safety function, so that if the computer program should lock up for any reason, the watch dog timer 42 would stop the operation of the laser system 10 to prevent it from being maintained in an operating condition. Each of the I/O ports 16 and 18, the digital word generator 20, the counter/timer board 24, the comm ports 38, and the watch dog timer 42 are well known devices in the art, and therefore their specific operation need not be discussed in specific detail. For example, the ninety-six channel digital I/O ports 16 and 18, the counter/timer board 24 and the comm ports 38 can be National Instrument boards and the digital word generator 20 can be a Quatech 100, all known in the art.

The laser system 10 is controlled by the operator through a control console 44. The control console 44 acts as the work station that the laser operator stands or sits at to run the laser system 10 for the various PLM operations. The control console 44 includes a computer monitor with a touch screen 46 to allow ease of control. The touch screen 46 allows the operator to touch different graphically displayed areas on the screen to easily adjust various parameters of the laser system 10, such as the pulse width and pulse rate control of the laser beam, polarization and modulation control, etc. for different PLM operations. The control console 44 also includes a series of control switches 48, such as a start button, a stop button, key switches to lock out the laser for safety purposes, or any other type of control switch specific to a certain laser system, as would be appreciated by those skilled in the art.

The control console 44 further includes a target monitor 50 that provides a visual indication of the laser beam during the PLM operation. The target monitor 36 can be a tiny liquid crystal display (LCD) mounted on the control console 30. Small target and alignment video cameras 52 are provided within the laser system 10 so that the operator can actually see the laser beam at a reduced beam intensity for beam alignment and beam quality purposes. The operator can select which of the target and alignment cameras 52 to display on the monitor 50 through the touch screen 46. An output from the touch screen 46 is applied to the industrial computer 14 and, through the digital I/O port 18, the computer 14 outputs a signal to a camera select circuit 54. The camera select circuit 54 outputs a signal to the target and alignment cameras 52 to select a camera whose image is displayed on the monitor 50. The display signals from the cameras 52 are sent to the target monitor 50 through the camera select circuit 54. A keyboard 56 is also provided at the control console 44 to allow more detailed access to the laser control functions and programming. The keyboard 56 will normally be locked away during operation of the laser system 10, and the operator will control the operation by the touch screen 46. The keyboard 56 can be used for maintenance purposes or actually access some part of the main program for more detailed control if needed.

The laser controller 12 includes a power supply interface isolation system 58 that is the interface between the industrial computer 14, through the I/O port 16, and the primary power supplies 60 of the laser system 10. Typically, there is an individual power supply 60 for each diode array. The power supply interface isolation system 58 provides a digital interface signal from each power supply 60 to the computer 14 for isolation purposes to prevent a fault in the power from the primary power supplies 60 from damaging the computer 14. The power supply interface system 58 includes several integrated circuit chips that digitally feed an optoisolator (not shown) in each primary power supply 60. The actual integrated circuit chips can be any suitable existing integrated circuit that performs this function, as would be well known to those skilled in the art.

A controls and monitor electronics system 62 is a digital interface to the computer 14 through the I/O port 18 for safety and system interlocks 64 of the laser system 10. The safety and system interlocks 64 would include various system level safety systems, such as laser cover interlocks, mirror temperature sensors, as well as other safety systems existing within the laser system 10. Sensors (not shown) are provided behind some of the mirrors in the system 10, so that if the laser beam burns through a mirror, this burn through will be detected and the system 10 will be shut down through the controls and monitor electronics 62. Additionally, the laser system 10 includes certain interlock safety systems that if not properly activated, or are breached, will shut down the operation of the laser system 10. In other words, the controls and monitor electronics 62 monitor the various safety and system interlocks 64 to allow the computer 14 to shut off the laser beam in the event of some type of safety breach in the system 10.

Laser mirror motor control electronics 66 provide a manual control of the mirrors in the system 10 by controlling mirror motors 68 that drive the mirrors (not shown). The control electronics 66 apply a voltage to the mirror motors 68, and then determines what kind of loading is on the motor 68. The control electronics 66 uses the EMF from the mirror motor 68 to determine motor loading in this manner. The computer touch screen 46 includes a touch control that provides an output through the I/O 18 to the laser mirror motor control electronics 66 to move the mirrors to adjust beam quality and the like. Therefore, instead of having to open the laser system 10 to adjust the mirrors, the operator can view the laser beam on the target monitor 50, and adjust the mirrors by the touch screen 46 for alignment purposes to increase beam quality.

System shut down electronics 70 provides an interface from user interlocks 72 to the computer 14. The user interlocks 72 are those safety switches and locks that the user of the system 10 can selectively connect depending on the location and application of the system. For example, the actual laser is typically located in a separate room, where the doors to the room include door interlocks such that if the door is opened during operation, the laser will shut off. The system shut down electronics 70 bypass the computer 14 and directly shuts down the primary power supplies 60 through the isolation system 58. Additionally, the system shut down electronics 70 gates off the pulses to block them so they are prevented from being outputted from the computer. In this manner, the computer's operation doesn't prevent a safety interlock in the event that the computer 14 locks up, and all of the safety controls are lost.

The controller 12 discussed above provides controlled ramping of the beam output intensity and modulation from one output setting to a next output setting during actual operation of a PLM operation. Additionally, the various features of the controller 12 discussed above provide increased operator convenience and accuracy over known laser controllers in the art.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A laser controller for controlling the operating parameters of a laser system, said laser system generating a laser beam output, said controller comprising:

a control computer, said computer receiving input signals and providing output signals to control the laser controller and the laser system, said computer including a counter circuit that is operable to ramp the laser beam output from a first predetermined beam intensity to a second predetermined beam intensity during a particular laser operation; said computer including a pattern generator that is operable to ramp a laser beam modulator to modulate the output beam into a stream of pulses; and a control console, said control console including a console system for allowing a laser operator to control the laser system, said console system outputting signals to the computer to control the laser system.

2. The controller according to claim 1 wherein the laser system includes a plurality of diode arrays that are selectively energized to generate a light output to create a lasing action in at least one gain module, said computer including a counter circuit that is programmed with a predetermined operation to energize each of the diode arrays in a predetermined sequence.

3. The controller according to claim 2 further comprising a pulse phasing system, said pulse phasing system being responsive to signals from the counter circuit to control the energizing sequence of the diode arrays.

4. The controller according to claim 3 wherein the pulse phasing system controls the energizing sequence of the diode arrays so that the diode arrays are energized in a sequence where only one array is energized at a time to cause the laser beam output to be a continuous output.

5. The controller according to claim 3 wherein the pulse phasing system includes a plurality of end of pulse detectors, where each pulse detector detects a falling edge of a pulse from the counter circuit energizing one diode array to cause the counter circuit to generate a pulse to energize a next diode array.

6. The controller according to claim 1 wherein the pattern generator outputs a signal to a modulator to modulate the beam output into a stream of high peak intensity pulses.

7. The controller according to claim 1 wherein the control console includes a computer monitor having a touch screen, said operator controlling the operation of the laser system by the touch screen.

8. The controller according to claim 1 wherein the control console includes a target monitor and the laser system includes a plurality of target and alignment cameras, said target monitor displaying the laser beam viewed by the cameras.

9. The controller according to claim 1 further comprising a power supply interface system, said power supply interface system isolating the control computer from a plurality of primary power supplies.

10. The controller according to claim 1 further including a laser mirror motor control system for controlling a plurality of laser mirrors associated with the laser system, wherein the operator controls the laser mirrors through the control console.

11. The controller according to claim 1 further comprising system shut down electronics, said system shut down electronics bypassing the control computer and shutting down a primary power supply of the laser system in the event of a safety breach.

12. A laser controller for controlling the operation of a laser system, said laser system including at least one gain module, said gain module including a plurality of diode arrays, where each diode array is driven by a diode array driver, said diode arrays generating a light intensity output to cause a lasing action in the at least one gain module to generate a laser beam output, said controller comprising:

a control system, said control system receiving input signals and providing output signals to control the laser controller and the laser system, said control system being programmed to perform a predetermined laser operation, said control system including a diode array controller that outputs a signal to the diode array drivers to control when the diodes in the diode arrays are energized, said diode array controller being operable to ramp the laser beam output from a first predetermined beam intensity to a second predetermined beam intensity and operable to control a sequencing of energizing the diode arrays; and a control console, said control console providing an operator interface for allowing a laser operator to control the laser system, said control console outputting signals to the control system to control the operation of the laser system.

13. The controller according to claim 12 wherein the diode array controller includes a pattern generator, said pattern generator outputting a signal to a modulator to modulate the beam output into a stream of high peak intensity pulses.

14. The controller according to claim 12 wherein the diode array controller includes a pulse phasing system having a counter circuit and a plurality of end of pulse detectors, said counter circuit outputting a plurality of pulses to the diode array drivers to sequence the diode arrays, wherein each end of pulse detector detects a falling edge of a pulse from the counter circuit so as to cause the counter circuit to generate a next pulse to energize a next diode array.

15. The controller according to claim 12 wherein the control system includes a computer monitor having a touch screen, said operator controlling the operation of the laser system by the touch screen.

16. The controller according to claim 12 wherein the control console includes a target monitor and the laser system includes a plurality of target and alignment cameras, said target monitor displaying the laser beam viewed by the cameras.

17. The controller according to claim 12 further comprising a power supply interface system, said power supply interface system isolating the control computer from a plurality of primary power supplies.

18. The controller according to claim 12 further including a laser mirror motor control system for controlling a plurality of laser mirrors associated with the laser system, wherein the operator controls the laser mirrors through the control console.

19. The controller according to claim 12 further comprising system shut down electronics, said system shut down electronics bypassing the control computer and shutting down a primary power supply of the laser system in the event of a safety breach.

20. A laser controller for controlling the operating parameters of a laser system, said laser system generating a laser beam output, said controller comprising:

a control system, said control system receiving input signals and providing output signals to control the laser controller and the laser system, said control system including a counter circuit that sets a predetermined beam pulse width and pulse rate of the laser beam output and is operable to ramp the intensity of the beam output from a first predetermined intensity to a second predetermined intensity; said computer including a pattern generator that is operable to ramp a laser beam modulator to modulate the output beam into a stream of pulses; and a control console, said control console providing an operator interface for allowing a laser operator to control the laser system, said control console including a monitor having a touch screen, said operator controlling the operation of the laser system by the touch screen, said touch screen allowing the operator to output a signal to the control system to adjust the laser beam pulse width and pulse rate, said control console further including a target monitor and the laser system including a plurality of target and alignment cameras, said target monitor displaying the laser beam viewed by the cameras.

21. The controller according to claim 20 wherein the laser system includes a plurality of diode arrays that are selectively energized to generate a light output to create a lasing action in at least one gain module, said computer including a counter circuit that is programmed with a predetermined operation to energize each of the diode arrays in a predetermined sequence.

22. The controller according to claim 20 further comprising a power supply interface system, said power supply interface system isolating the control computer from a plurality of primary power supplies.

23. The controller according to claim 20 further including a laser mirror motor control system for controlling a plurality of laser mirrors associated with the laser system, wherein the operator controls the laser mirrors through the control console.

24. The controller according to claim 20 further comprising system shut down electronics, said system shut down electronics bypassing the control computer and shutting down a primary power supply of the laser system in the event of a safety breach.

* * * * *